United States Patent [19]
Lien

[11] Patent Number: 5,173,627
[45] Date of Patent: Dec. 22, 1992

[54] CIRCUIT FOR OUTPUTTING A DATA SIGNAL FOLLOWING AN OUTPUT ENABLE COMMAND SIGNAL

[75] Inventor: Chuen-Der Lien, Mountain View, Calif.

[73] Assignee: Integrated Device Technology, Inc., Santa Clara, Calif.

[21] Appl. No.: 731,502

[22] Filed: Jul. 17, 1991

[51] Int. Cl.$^5$ .............................................. H03K 19/00
[52] U.S. Cl. .................................. 307/443; 307/448; 307/473
[58] Field of Search ................ 307/443, 445, 448, 473

[56] References Cited

U.S. PATENT DOCUMENTS

| | | |
|---|---|---|
| 4,703,203 | 10/1987 | Gallup et al. .................... 307/473 |
| 5,025,182 | 6/1991 | Farmer ............................. 307/473 |

OTHER PUBLICATIONS

Will C. H. Gubbels et al., "A 40-ns/100-pF Low-Poer Full-CMOS 256K (23Kx8) SRAM", IEEE Jour. of Solid-State Cir., vol. SC-22, No. 5, Oct. 1987, p. 741.
Thaddeus Gabra et al., "Ground Bounce Control inCMOS Integrated Circuits", IEEE International Solid-State Cir. Conf., p. 88, Feb. 1988.
Karl L. Wang et al., "A 21-ns 32Kx8 CMOS Static RAM with a Selectively Pumped p-well Array", IEEE Jour. of Solid-State Cir., vol. SC-22, No. 5, Oct. 1987, p. 704.
George Canepa et al., "A 90ns 4Mb CMOS EPROM", IEEE Int'n Solid-State Cir. Conf., p. 120, Feb. 1988.
Tomohisa Wada et al., "A 34-ns 1-Mbit CMOS SRAM Using Triple Polysilicon", IEEE Journal of Solid-State Cir., vol. SC-22, No. 5, Oct. 1987, p. 727.

*Primary Examiner*—Robert J. Pascal
*Attorney, Agent, or Firm*—Limbach & Limbach

[57] ABSTRACT

The invention provides an output enable control circuit with a three gate delay. The circuit includes a CMOS passgate or other transmission control and filtering means, one or more shunting transistors, and an output driver. The CMOS passgate, in conjunction with a first shunting transistor, allows an output enable command to control transmission of the data signal to the output driver. By properly tuning the CMOS passgate, bounce on the power supply and ground lines can be minimized. A second shunting transistor can be included to allow other data control signals, such as a write enable or chip select signal, to cease data output by the circuit. Additionally, a third shunting transistor, controlled by the data signal, can be included to allow fast turn off of the output driver.

17 Claims, 1 Drawing Sheet

5,173,627

CIRCUIT FOR OUTPUTTING A DATA SIGNAL FOLLOWING AN OUTPUT ENABLE COMMAND SIGNAL

FIELD OF THE INVENTION

This invention relates to memory devices, and in particular, to an output enable control circuit which controls the output of data from the memory device to a system bus or other destination.

BACKGROUND OF THE INVENTION

As the processing speed of computers increases, the need for faster access to instructions and data increases correspondingly. Reducing the delay time, $T_{aoe}$, between the initiation of an output enable command signal and the commencement of data output onto a system bus facilitates faster data access.

Concomitant with faster output data rates is the problem of noise generation. Noise, or bounce, on the power supply and ground lines can be generated by reactive loads coupled to the output drivers and the power supply and ground lines.

Various implementations of output enable control circuits have been developed with these two considerations in mind. See for example, Gubbels et al, "A 40-ns/100-pF Low-Power Full-CMOS 256K (32K×8) SRAM," IEEE Journal of Solid-State Circuits, Vol. SC-22, No. 5, p. 741, Oct. 1987; Gabara et al, "Ground Bounce Control in CMOS Integrated Circuits," Int'l Solid-State Circuits Conference, p. 88, 1988; Wang et al, "A 21-ns 32K×8 CMOS Static RAM with a Selectively Pumped p-Well Array," IEEE Journal of Solid-State Circuits, Vol. SC-22, No. 5, p. 704, Oct. 1987; Canepa et al, "A 90 ns 4Mb CMOS EPROM," Int'l Solid-State Circuits Conference, p. 120, 1988; and Wada et al, "A 34-ns 1-Mbit CMOS SRAM Using Triple Polysilicon," IEEE Journal of Solid-State Circuits, Vol. SC-22, No. 5, p. 727, Oct. 1987.

SUMMARY OF THE INVENTION

The invention provides an output enable control circuit with having a three gate delay. The circuit includes a CMOS passgate or other transmission control and filtering means, one or more shunting transistors, and an output driver. The CMOS passgate, in conjunction with a first shunting transistor, allows an output enable command to control transmission of the data signal to the output driver. By properly tuning the CMOS passgate, bounce on the power supply and ground lines can be minimized.

DETAILED DESCRIPTION OF THE PREFERRED EMBODIMENT

Figure 1:
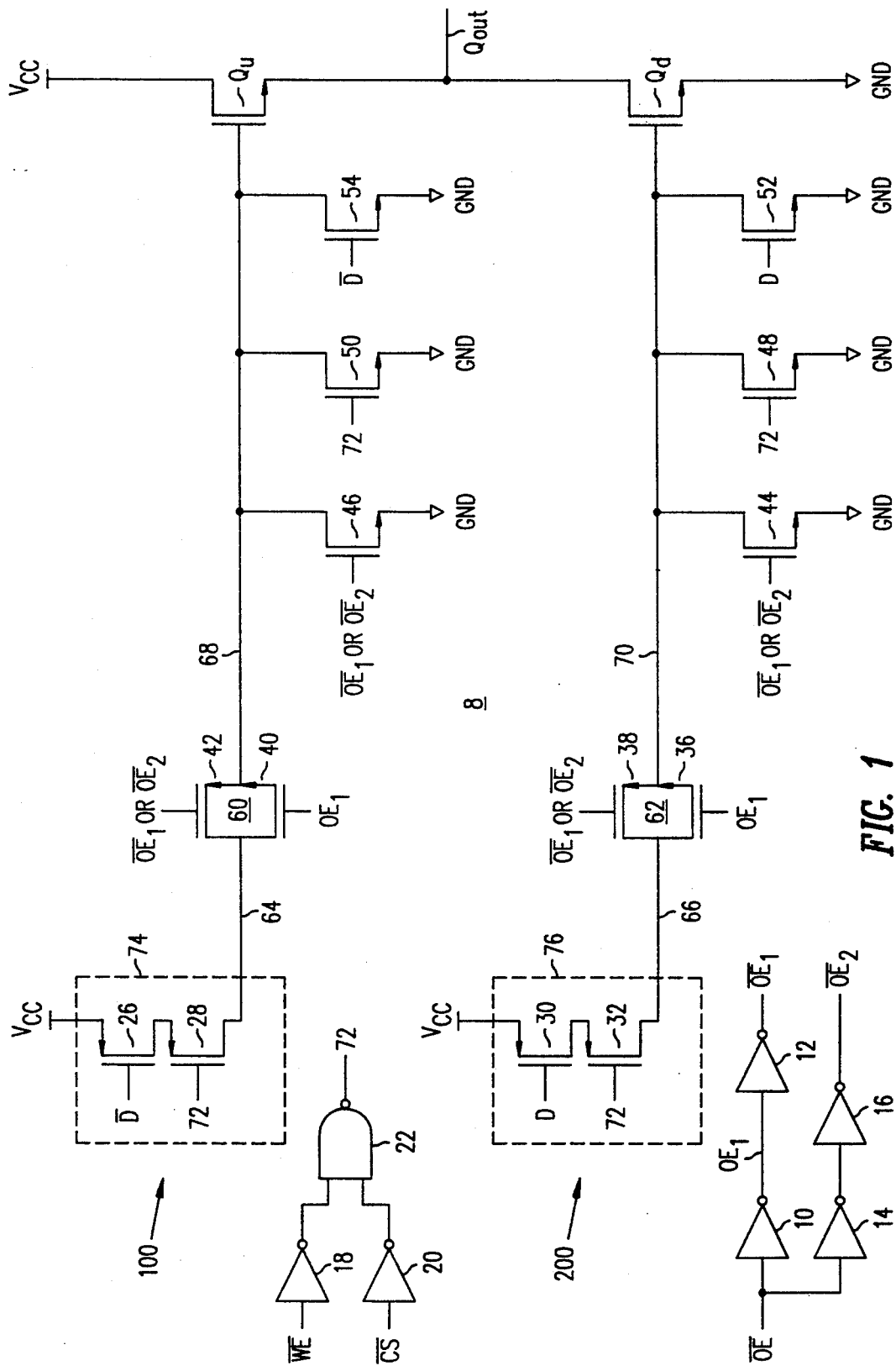
FIG. 1 is a circuit diagram illustrating the preferred embodiment of the present invention.

Referring to FIG. 1 there is shown an output enable control circuit 8 of the present invention. Data output is supplied at the $Q_{out}$ initiated when the output enable $\overline{OE}$, write disable $\overline{WE}$, and chip select $\overline{CS}$ command signals are all LOW.

Normally, the write disable $\overline{WE}$ and chip select $\overline{CS}$ command signals are initiated prior to the output enable $\overline{OE}$ command signal. Inverters 18 and 20 receive the write disable $\overline{WE}$ and chip select $\overline{CS}$ command signals as inputs respectively, and generate as outputs, the inputs to NAND gate 22. NAND gate 22 then generates as output, data control signal 72.

Data path 100 controls the switching of output transistor $Q_u$. NOR gate 74, which can be implemented by two p-channel MOSFETs 26 & 28 (PMOS-FETs), receives as inputs, an inverted data signal $\overline{D}$ and the data control signal 72, and generates as output, data path signal 64.

Transmission of data path signal 64 to output transistor $Q_u$ is then controlled by CMOS passgate 60 and shunting transistors 46, 50 and 54. Transmission is allowed when CMOS passgate 60 is ON, and shunting transistors 46, 50 and 54 are all OFF.

Both CMOS passgate 60 and shunting transistor 46 are controlled by the output enable $\overline{OE}$ command signal. Inverter 10 receives as input, the output enable $\overline{OE}$ command signal, and generates as output, an inverted output enable $OE_1$ command signal. Inverter 12 receives as input, the inverted output enable $OE_1$ command signal, and generates as output, its inverse $\overline{OE}_1$.

Before data is to be outputted, $\overline{OE}$ is HIGH, $OE_1$ is LOW, and $\overline{OE}_1$ is HIGH. Since $OE_1$ gates to n-channel MOSFET 40 (NMOS-FET) of CMOS passgate 60, this means that n-channel MOSFET 40 is turned OFF. In addition, since $\overline{OE}_1$ gates to p-channel MOSFET 42 of CMOS passgate 60 and n-channel MOSFET 46, this means that p-channel MOSFET 42 is turned OFF and n-channel MOSFET 46 is turned ON. Thus, CMOS passgate 60 is OFF and any residual current that might flow towards $Q_u$ is shorted to ground through shunting transistor 46.

On the other hand, when data is to be outputted, $\overline{OE}$ is LOW, $OE_1$ is HIGH, and $\overline{OE}_1$ is LOW. As a result, both n-channel MOSFET 40 and p-channel MOSFET 42 of CMOS passgate 60 are turned ON, and shunting transistor or 46 is turned OFF. Thus, transmission of data path signal 64 is allowed to enter CMOS passgate 60. The data from the CMOS passgate exits slightly modified, i.e. filtered through the dynamics of the passgate, as data path signal 68. By properly tuning MOSFETs 40 and 42, data path signal 68 can be conditioned to minimize bounce on the power supply and ground lines.

In a like fashion, data path 200 controls the switching of output transistor $Q_d$. However, since NOR gate 76 receives data signal D instead of its inverse, $\overline{D}$, its output, data path signal 66, will always be the inverse of data path signal 64.

The output driver consists of the push-pull transistor pair, $Q_u$ and $Q_d$. When $Q_u$ is ON, $Q_d$ is OFF, and the data output $Q_{out}$ is pulled-up to $V_{cc}$. Conversely, when $Q_u$ is OFF, $Q_d$ is ON, and the data output $Q_{out}$ is pushed-down to $G_{nd}$.

Thus, when data is to be outputted and the data signal D is HIGH, $\overline{D}$ is LOW, the data control signal 72 is LOW, data path signals 66 and 70 are LOW, and data path signals 64 and 68 are HIGH. As a result, $Q_u$ is ON, $Q_d$ is OFF, and the data output $Q_{out}$ is pulled-up to $V_{cc}$. Conversely, when the data signal D is LOW, $\overline{D}$ is HIGH, the data control signal 72 is LOW, data path signals 66 and 70 are HIGH, and data path signals 64 and 68 are LOW. As a result, $Q_u$ is OFF, $Q_d$ is ON, and the data output $Q_{out}$ is pushed-down to $G_{nd}$.

As can be seen from the foregoing, there are three logic gates which control the output of the data signal. The logic gates through which the data signal must pass are the CMOS pass gate 60, the shunting transistor 46, and the output driver transistor $Q_u$. Since there are only three gates through which the data signal must pass, the output enable control circuit is very fast with minimal delay.

To cease data output, both output transistors $Q_u$ and $Q_d$ must be turned OFF. As described previously, this can be accomplished by the output enable $\overline{OE}$ command signal being HIGH, which would turn OFF CMOS passgates 60 and 62, and turn ON shunting transistors 46 and 44. In addition, both output transistors $Q_u$ and $Q_d$ can be turned OFF at the same time by simultaneously shorting data path signal 68 to ground through shunting transistor 50 and shorting data path signal 70 to ground through shunting transistor 48. Since both shunting transistors 50 and 48 are controlled by data control signal 72, this would occur whenever either the write disable $\overline{WE}$ or chip select $\overline{CS}$ command signal is HIGH.

When data is to be outputted and the data signal D switches from HIGH to LOW, $Q_u$ must switch from ON to OFF, and $Q_d$ must switch from OFF to ON. Conversely, when the data signal D switches from LOW to HIGH, $Q_u$ must switch from OFF to ON, and $Q_d$ must switch from ON to OFF. To facilitate rapid turn OFF of $Q_u$ when D switches to LOW, $\overline{D}$ activates shunting transistor 54 to divert $Q_u$'s gate current to ground. In a like fashion, to facilitate rapid turn OFF of $Q_d$ when D switches to HIGH, D activates shunting transistor 52 to divert $Q_d$'s gate current to ground.

What is claimed is:

1. A circuit for outputting a data signal following the commencement of an output enable command signal, said circuit comprising:
    a data control signal;
    a NOR gate logic means for receiving the data signal and said data control signal, and generating an input signal in response thereto;
    a first logic means for receiving the input signal, the data signal, controlling transmission of said data signal by the output enable command signal, and generating a first logic signal in response thereto;
    a second logic means for receiving the first logic signal, controlling transmission of said first logic signal by the output enable command signal, and generating a second logic signal in response thereto; and
    a third logic means for receiving the second logic signal and generating an output data signal.

2. A circuit as recited in claim 1 wherein said NOR gate logic means comprises:
    A. a first PMOS-FET having a source, a gate, and a drain; and
    B. a second PMOS-FET having a source, a gate, and a drain; where
    C. said source of the first PMOS-FET is connected to a voltage supply; said gate of the first PMOS-FET receives the data signal; said drain of the first PMOS-FET is connected to said source of the second PMOS-FET; said gate of the second PMOS-FET receives the data control signal; and said drain of the second PMOS-FET generates the input signal to the first logic means.

3. A circuit as recited in claim 1 wherein the first logic means comprises:
    A. a transmission means for receiving said data signal and the output enable command signal, and generating the first logic signal in response thereto.

4. A circuit for outputting a data signal following the commencement of an output enable command signal, said circuit comprising:
    a first inverter for receiving the output enable command signal, and generating an inverse output enable command signal;
    a second inverter for receiving said inverse output enable command signal, and generating an inverse, inverse output enable command signal;
    a CMOS passgate for receiving the data signal, said inverse output command signal, and said inverse, inverse output command signal, and for generating a first logic signal in response thereto;
    a second logic means for receiving the first logic signal, controlling transmission of said first logic signal by the output enable command signal, and generating a second logic signal in response thereto; and
    a third logic means for receiving the second logic signal and generating an output data signal.

5. A circuit for outputting a data signal following the commencement of an output enable command signal, said circuit comprising:
    a first logic means for receiving the data signal, controlling transmission of said data signal by the output enable command signal, and generating a first logic signal in response thereto;
    a first inverter for receiving the output enable command signal, and generating an inverse output enable command signal;
    a second inverter for receiving said inverse output enable command signal, and generating an inverse, inverse output enable command signal;
    a NMOS-FET having a source, a gate and a drain;
        i. said source for receiving the first logic signal;
        ii. said gate for receiving said inverse, inverse output enable command signal;
        iii. said drain connected to a ground potential line; and
        iv. wherein a second logic signal is produced at said source; and
    a third logic means for receiving the second logic signal and generating an output data signal.

6. A circuit as recited in claim 1 further comprising a fourth logic means for receiving the second logic signal, the data control signal, and the data signal, and generating an input to the third logic means in response thereto.

7. A circuit as recited in claim 6 wherein the fourth logic means comprises:
    A. a first NMOS-FET having a source, a gate, and a drain;
        i. said source for receiving the second logic signal;
        ii. said gate for receiving the data control signal; and
        iii. said drain connected to a ground potential line; and
    C. a second NMOS-FET having a source, a gate, and a drain;
        i. said source for receiving the second logic signal;
        ii. said gate for receiving the data signal;
        iii. said drain connected to a ground potential line; and
        iv. wherein an input to the third logic means is produced at said source.

8. A circuit as recited in claim 1 further including data control logic for generating the data control signal, said data control logic comprising:

A. a first inverter means for receiving a write enable signal, and for generating an inverted write enable signal in response thereto;

B. a second inverter means for receiving a chip select signal, and for generating an inverted write enable signal in response thereto; and C. a NAND gate for receiving said inverted write enable signal and said inverted chip select signal, and generating the data control signal in response thereto.

9. A circuit for outputting a data signal following the commencement of an output enable command signal, said circuit comprising:

A. a first data path; said first data path having;
  i. a first logic means for receiving the data signal, controlling transmission of said data signal by the output enable command signal, and generating a first logic signal in response thereto;
  ii. a second logic means for receiving said first logic signal, controlling transmission of said first logic signal by the output enable command signal, and generating a second logic signal in response thereto;

B. a second data path; said second data path having;
  i. an inverter for receiving the data signal, and generating an inverted data signal in response thereto;
  ii. a third logic means for receiving said inverted data signal, controlling transmission of said inverted data signal by the output enable command signal, and generating a third logic signal in response thereto;
  iii. a fourth logic means for receiving said third logic signal, controlling transmission of said third logic signal by the output enable command signal, and generating a fourth logic signal in response thereto;

C. an output logic means for receiving said second logic signal and said fourth logic signal, and generating an output data signal in response thereto.

10. A circuit as recited in claim 9 further comprising:

A. a data control signal;

B. a first NOR gate logic means for receiving the data signal and said data control signal, and generating an input to the first logic means in response thereto; and C. a second NOR gate logic means, interposed between the inverter and the third logic means, for receiving the inverted data signal and said data control signal, and generating an input to the third logic means in response thereto.

11. A circuit as recited in claim 10 wherein:

A. the first NOR gate logic means comprises;
  i. a first PMOS-FET having a source, a gate, and a drain; and
  ii. a second PMOS-FET having a source, a gate, and a drain; where
  iii. said source of the first PMOS-FET is connected to a voltage supply; said gate of the first PMOS-FET receives the data signal; said drain of the first PMOS-FET is connected to said source of the second PMOS-FET; said gate of the second PMOS-FET receives the data control signal; and said drain of the second PMOS-FET generates the input to the first logic means;

B. the second NOR gate logic means comprises;
  i. a third PMOS-FET having a source, a gate, and a drain; and
  ii. a fourth PMOS-FET having a source, a gate, and a drain; where
  iii. said source of the third PMOS-FET is connected to said voltage supply; said gate of the third PMOS-FET receives the inverted data signal; said drain of the third PMOS-FET is connected to said source of the fourth PMOS-FET; said gate of the fourth PMOS-FET receives the data control signal; and said drain of the fourth PMOS-FET generates the input to the third logic means.

12. A circuit as recited in claim 9 wherein:

A. the first logic means comprises;
  i. a first transmission means for receiving said data signal and the output enable command signal, and generating the first logic signal in response thereto; and B. the third logic means comprises;
  i. a second transmission means for receiving said inverted data signal and the output enable command signal, and generating the third logic signal in response thereto.

13. A circuit as recited in claim 10 wherein:

A. the first logic means comprises;
  i. a first inverter for receiving the output enable command signal, and generating an inverse output enable command signal;
  ii. a second inverter for receiving said inverse output enable command signal, and generating an inverse, inverse output enable command signal; and
  iii. a first CMOS passgate for receiving the data signal, said inverse output command signal, and said inverse, inverse output enable command signal, and for generating the first logic signal in response thereto; and B. the third logic means comprises;
  i. a first inverter for receiving the output enable command signal, and generating an inverse output enable command signal;
  ii. a second inverter for receiving said inverse output enable command signal, and generating an inverse, inverse output enable command signal; and
  iii. a second CMOS passgate for receiving the inverted data signal, said inverse output command signal, and said inverse, inverse output enable command signal, and for generating the third logic signal in response thereto.

14. A circuit as recited in claim 9 wherein:

A. the second logic means comprises;
  i. a first inverter for receiving the output enable command signal, and generating an inverse output enable command signal in response thereto;
  ii. a second inverter for receiving said inverse output enable command signal, and generating an inverse, inverse output enable command signal in response thereto;
  iii. a NMOS-FET having a source, a gate, and a drain;
    a. said source for receiving the first logic signal;
    b. said gate for receiving said inverse, inverse output enable command signal;
    c. said drain connected to a ground potential line; and
    d. wherein the second logic signal is produced at said source; and B. the fourth logic means comprises;

i. a first inverter for receiving the output enable command signal, and generating an inverse output enable command signal in response thereto;
ii. a second inverter for receiving said inverse output enable command signal, and generating an inverse, inverse output enable command signal in response thereto;
iii. a NMOS-FET having a source, a gate, and a drain;
   a. said source for receiving the third logic signal;
   b. said gate for receiving said inverse, inverse output enable command signal;
   c. said drain connected to a ground potential line; and
   d. wherein the fourth logic signal is produced at said source.

15. A circuit as recited in claim 10 further comprising:
A. a fifth logic means interposed between the second logic means and the output logic means; said fifth logic means for receiving the second logic signal, the data control signal, and the data signal, and generating a first input to the output logic means in response thereto; and
B. a sixth logic means interposed between the fourth logic means and the output logic means; said sixth logic means for receiving the fourth logic signal, the data control signal, and the inverted data signal, and generating a second input to the output logic means in response thereto.

16. A circuit as recited in claim 15 wherein:
A. the fifth logic means comprises;
   i. a first NMOS-FET having a source, a gate, and a drain;
      a. said source for receiving the second logic signal;
      b. said gate for receiving the data control signal; and
      c. said drain connected to a ground potential line; and
   ii. a second NMOS-FET having a source, a gate, and a drain;
      a. said source for receiving the second logic signal;
      b. said gate for receiving the data signal;
      c. said drain connected to a ground potential line; and
      d. wherein the first input to the output logic means is produced at said source; and
B. the sixth logic means comprises;
   i. a third NMOS-FET having a source, a gate, and a drain;
      a. said source for receiving the fourth logic signal;
      b. said gate for receiving the data control signal; and
      c. said drain connected to a ground potential line; and
   iii. a fourth NMOS-FET having a source, a gate, and a drain;
      a. said source for receiving the fourth logic signal;
      b. said gate for receiving the inverted data signal;
      c. said drain connected to a ground potential line; and
      d. wherein the second input to the output logic means is produced at the said source.

17. A circuit as recited in claim 9 wherein the output logic means comprises:
A. a first NMOS-FET having a source, a gate, and a drain; and
B. a second NMOS-FET having a source, a gate, and a drain; where
C. said source of the first NMOS-FET is connected to a voltage supply; said gate of the first NMOS-FET receives the second logic signal; said drain of the first NMOS-FET is connected to said source of the second NMOS-FET; said gate of the second NMOS-FET receives the fourth logic signal; said drain of the second NMOS-FET is connected to a ground potential line; and wherein the output data signal is produced at said source of the second NMOS-FET.

* * * * *